United States Patent [19]
Sikkink et al.

[11] Patent Number: 5,424,658
[45] Date of Patent: Jun. 13, 1995

[54] BIPOLAR ECL TO INVERTED CMOS LEVEL TRANSLATOR

[75] Inventors: Mark R. Sikkink, Chippewa Falls; Terrance L. Bowman, Altoona, both of Wis.

[73] Assignee: Cray Research, Inc., Eagan, Minn.

[21] Appl. No.: 165,156

[22] Filed: Dec. 10, 1993

[51] Int. Cl.[6] .................................... H03K 19/0195
[52] U.S. Cl. ...................................... 326/77; 326/66; 326/126
[58] Field of Search ............... 307/455, 443, 475, 553; 326/66, 77, 126

[56] References Cited

U.S. PATENT DOCUMENTS

| | | | |
|---|---|---|---|
| 4,849,659 | 7/1989 | West | 307/475 |
| 5,030,856 | 7/1991 | Dansky | 307/475 |
| 5,075,580 | 12/1991 | Dayton | 307/475 |
| 5,283,482 | 2/1994 | Chen | 307/475 |
| 5,321,320 | 6/1994 | Collins | 307/475 |

*Primary Examiner*—David R. Hudspeth
*Assistant Examiner*—Andrew Sanders
*Attorney, Agent, or Firm*—Schwegman, Lundberg & Woessner

[57] ABSTRACT

A level shifting circuit which can be implemented as part of a bipolar ECL integrated circuit, provides reliable switching and level shifted output suitable for driving a low voltage CMOS integrated circuit. The circuit includes a level shifting circuit which is connected to trigger a high gain positive feedback bootstrap circuit to reliably ensure switching even under poor signal conditions. An output taken from one of the switched pair is allowed to go to $V_{CC}$, 0 volts, or is clamped by a clamping circuit to −3.3 volts, representing the two output states suitable for driving inverted rail CMOS circuitry.

8 Claims, 1 Drawing Sheet

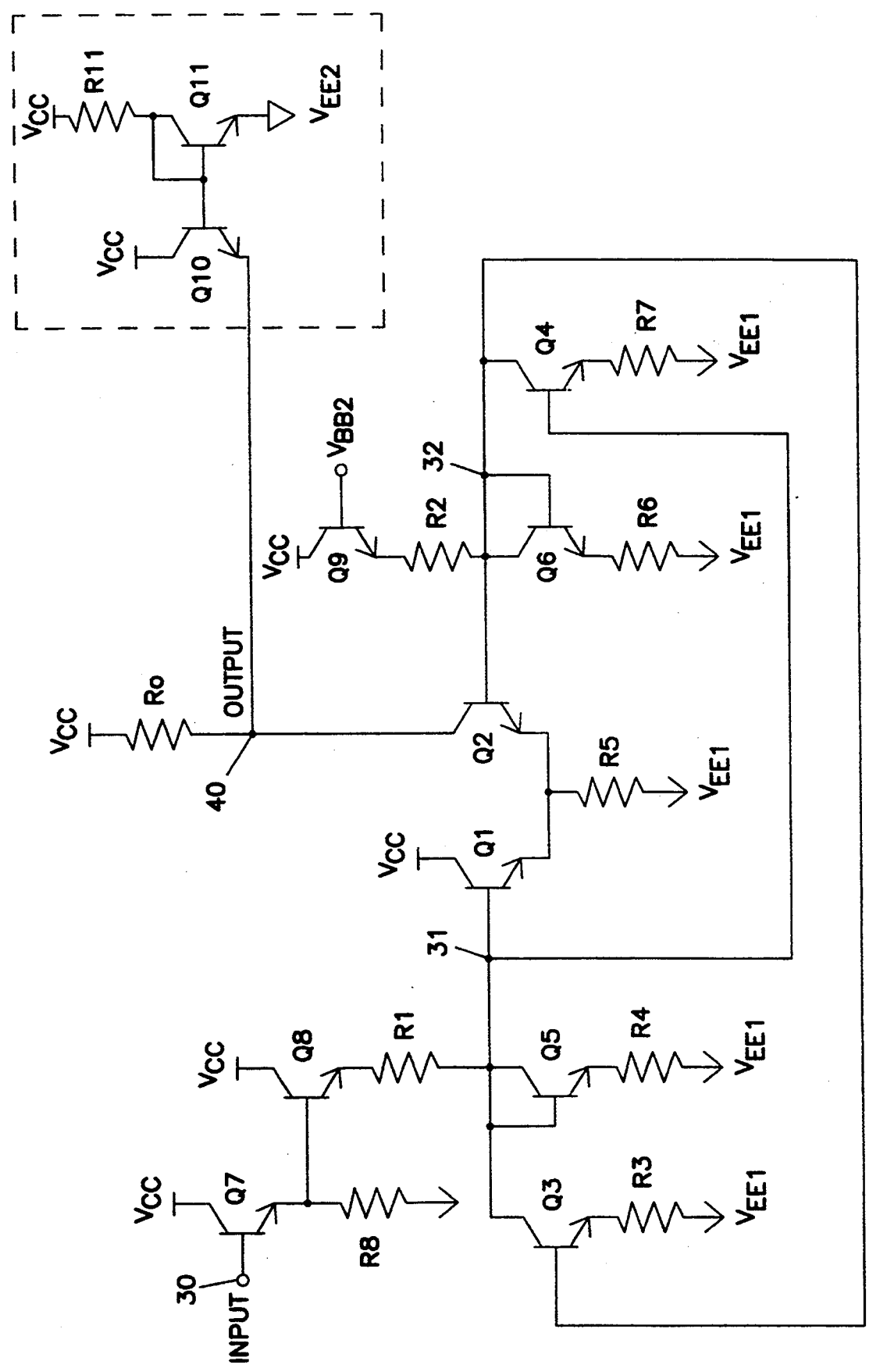

BIPOLAR ECL TO INVERTED CMOS LEVEL TRANSLATOR

FIELD OF THE INVENTION

The present invention relates generally to the field of electronic digital integrated circuits. In particular, the present invention pertains to a level translator circuit, which can be implemented in bipolar ECL technology, and which provides output levels suitable for driving low voltage CMOS integrated circuits.

BACKGROUND OF THE INVENTION

In the field of electronic integrated circuits, a number of different technologies and processes have been developed, resulting in the availability of a number of different families of integrated circuit types. Two examples which are discussed herein are bipolar and CMOS. Each of these families has its own advantages and disadvantages, in terms of operating speed, density, power consumption, cost, noise immunity, and other factors. The choice of integrated circuit type for a given application is often a balancing of these various factors. Because different IC types are best suited for different applications, there will be situations in which different IC types are brought together in a single system. However, this presents a problem in terms of interconnections, because the different technologies use different voltages, polarity and other electrical parameters. This leads to the need for various types of external level shifting and signal translation circuits, but this adds to the cost, space and power requirements for a system.

The present invention provides a level shifter circuitry on board a chip of one IC technology, to thereby provide the necessary level shifting and interface for direct connection to an IC of another technology. The preferred embodiment is directed to providing signals from a bipolar IC to a CMOS IC. One application for the invention would be in a system which uses a CMOS microprocessor, with bipolar supporting circuitry, where it is necessary for the bipolar IC to send logic signals to the CMOS IC.

SUMMARY OF THE INVENTION

The present invention provides an improved level shifter-driver that can be implemented on an IC of one chip technology, and which provides an output suitable for driving an input of an IC of a different chip technology. The preferred embodiment provides a level shifting circuitry implemented in a bipolar IC, for providing signals suitable for driving LVCMOS (low voltage CMOS). In this manner logic signals developed on the bipolar IC can be output to an LVCMOS IC.

The improved driver includes a level shifter for receiving a logic signal in bipolar levels from circuitry on the bipolar IC, and applying a shifted signal to a high gain bootstrap circuit. The high gain bootstrap circuit responds to, and reinforces the logic level applied thereto by the level shifter, so as to switch cleanly on or off, according to the input state even for worst case conditions of input signal. An output of the high gain bootstrap circuit connects indirectly to the common ground voltage, and through a clamping circuit to a negative voltage, corresponding to the inverted rail CMOS levels. The output thus provided is suitable for driving inverted rail LVCMOS levels.

BRIEF DESCRIPTION OF THE DRAWINGS

In the drawing, FIG. 1 shows a bipolar implementation of the driver circuit of the present invention, suitable for developing output voltages for use in inverted rail LVCMOS chips.

DETAILED DESCRIPTION OF THE PREFERRED EMBODIMENT

The circuit is implemented in bipolar transistor technology, and the supply levels therefor are indicated throughout the FIGURE by reference voltages $V_{CC}$, $V_{EE1}$ and $V_{EE2}$. Specifically, $V_{CC}$ equals 0 volts; $V_{EE1}$ equals −4.5 volts; and $V_{EE2}$ equals −3.3 volts.

Input 30 receives a signal developed or transmitted elsewhere on the bipolar IC chip. This is a normal level ECL (emitter coupled logic) level. It is applied to a level shifting network which is made up of transistors Q7,Q8, and associated components. Specifically, input 30 connects to the base of transistor Q7, and the emitter of transistor Q7 connects to the base of transistor Q8. The collectors of both transistors are connected to $V_{CC}$. A resistor R8 connects from the Q7 emitter/Q8 base, to $V_{EE1}$. The emitter of transistor Q8 connects through resistor R1 to a node 31. The ratio of the resistors determines the shifted level.

Node 31 can be thought of as the input to a high gain bootstrap circuit which is composed of transistors Q1-Q6, and associated components. The differential pair Q1,Q2 are switched by the operation of the high gain bootstrap circuit, as is described below, such that one of the pair will be on and the other off, and vice versa, in the two switched states of the circuit.

The base of transistor Q1 connects to node 31, and its collector connects $V_{CC}$. The base of transistor Q2 connects to node 32, and its collector connects to node 40, which becomes the output of the driver circuit. The emitters of the pair Q1,Q2 are connected in common through resistor R5 to $V_{EE1}$. Transistor Q5 is connected with its base and collector to node 31, and its emitter connects through resistor R4 to $V_{EE1}$. In similar fashion, transistor Q6 has its collector and base connected to node 32, and its emitter connected through R6 to $V_{EE1}$.

Transistor Q3 has its collector connected to node 31 and its emitter connected through resistor R3 to $V_{EE1}$. The base of transistor Q3 is connected to node 32. Similarly, transistor Q4 has its collector connected to node 32, its emitter connected through R7 to $V_{EE1}$, and its base connected to node 31. Transistor Q9 has its collector connected to $V_{CC}$, its base to a reference voltage $V_{BB2}$, which in effect provides the switching threshold reference for the circuit. The emitter of Q9 is connected through R2 to node 32.

Output 40 connects through resistor $R_0$ to $V_{CC}$. Node 40 is also connected to a clamping circuit, formed from transistors Q10,Q11 and associated circuitry. Specifically, the emitter of transistor Q10 connects to node 40, and its collector connects to $V_{CC}$. Transistor Q11 has its emitter connected to $V_{EE2} = -3.3$ volts. The bases of transistor Q10,Q11 are connected together, and to the collector of Q11, all of which connect through resistor R11 to $V_{CC}$.

The operation of the circuit is as follows. If the input signal to input 30 is high, transistors Q7 and Q8 will be turned on, and the signal at node 31 will also be high, although shifted to a level to help keep the differential pair Q1,Q2 properly biased.

With node 31 high, transistor Q4 is turned on, and the current developed through transistor Q4 will pull down the voltage at node 32. Since the node 32 is coupled to the base of transistor Q3, this reduces the current in Q3, which reinforces the high level at node 31. In this situation, Q1 is turned on, and Q2 is turned off. The bootstrapped gain from the positive feedback action provided by transistor Q3 and Q4 guarantees that the pair Q1,Q2 will be fully switched even for the worst case of input conditions.

With Q2 fully switched off, the output 40 is pulled up $V_{CC}$ or 0 volts, through resistor $R_O$. This level corresponds to one of the inverted rail CMOS levels needed by a CMOS IC that would be connected to receive the output 40.

When the input 30 goes low, transistors Q7 and Q8 will be turned off and node 31 will go low. This tends to reduce the current through transistor Q4, allowing the voltage at node 32 to go high. This in turn causes transistor Q3 to conduct, which further reinforces the lowering of the voltage at node 32. Once again the high gain bootstrapped positive feedback action ensures a complete switching. Q1 is then off and Q2 is on.

With Q2 on, the voltage at output 40 is driven low. There is sufficient gain in the clamping circuit and sufficient drive is applied thereto to activate transistors Q10 and Q11 to clamp the output at $V_{EE2}$ (−3.3 volts). This level corresponds to the other state for the inverted rail CMOS input level.

In this manner the switching of the normal ECL level applied to input 30 causes a corresponding switching of output 40, between 0 and −3.3 volt levels, which can then be used to drive CMOS compatible levels.

It will be understood by those skilled in the art that the present invention is not limited to the circuit embodiment discussed above, but may be changed or modified without departing from the spirit or scope of the invention.

What is claimed is:

1. A circuit for translating voltages suitable for a first IC technology type into voltages suitable for driving a second IC technology type, comprising:
   a level shifter having an input connected to receive a signal of said first technology type, and a shifter output, said level shifter operable to provide a scaled or shifted voltage at the shifter output in response to an applied input signal;
   a bistable switching circuit, having a first node connected to receive the output of said level shifter, a second node, positive feedback means means for providing positive feedback from said second node to said first node, and switching means connected to said first and second node to disable said positive feedback means, wherein said first and second nodes are in opposite states to each other and wherein said positive feedback means reinforce a low state at said first node;
   output means connected to said bistable switching circuit and operable in one state of the switching circuit to provide a first logic level appropriate to said second IC technology; and
   a clamping circuit connected to said output means and operable in a second output state of the bistable switching circuit to activate and clamp the output to a reference voltage corresponding to a second logical level appropriate to said second IC technology type.

2. A circuit according to claim 1 wherein said circuit is formed on a bipolar IC and provides translated output signals at CMOS levels.

3. A circuit according to claim 1 wherein said positive feedback means comprises a transistor having a base and a collector, wherein said collector is connected to said first node and said base is connected to said second node.

4. A circuit according to claim 1 wherein said switching means comprises a transistor having a base and a collector, wherein said collector is connected to said second node and said base is connected to said first node.

5. A circuit according to claim 1 wherein said clamping circuit comprises first and second bipolar transistors, wherein each bipolar transistor includes a base and a collector, and wherein said first transistor is connected to said output means and has its base connected to said base and collector of said second transistor.

6. A circuit for translating voltages suitable for a first IC technology type into voltages suitable for driving a second IC technology type, comprising:
   a level shifter having an input connected to receive a signal of said first technology type, and a shifter output, said level shifter operable to provide a scaled or shifted voltage at the shifter output in response to an applied input signal;
   a bistable switching circuit comprising first, second, third and fourth transistors, wherein each transistor has a base and a collector, wherein the first and second transistors form a differential pair having a first and a second node, said first node connected to receive the shifter output of said level shifter, wherein the collector of said third transistor is connected to said first node and the base of said third transistor is connected to said second node, and wherein the collector of said fourth transistor is connected to said second node and the base of said fourth transistor is connected to said first node,
   output means connected to said bistable switching circuit and operable in one state of the bistable switching circuit to provide a first logic level appropriate to said second IC technology; and
   a clamping circuit connected to said output means and operable in a second output state of the bistable switching circuit to activate and clamp the output to a reference voltage corresponding to a second logical level appropriate to said second IC technology type.

7. The circuit according to claim 6 wherein the clamping circuit comprises fifth and sixth bipolar transistors, wherein each transistor has a base and a collector, and wherein said fifth transistor is connected to said output means and has its base connected to a base and collector of said sixth transistor.

8. The circuit according to claim 6 wherein said circuit is formed on a bipolar IC and provides translated output signals at CMOS levels.

* * * * *